United States Patent
Suenaga et al.

(10) Patent No.: US 7,079,314 B1
(45) Date of Patent: Jul. 18, 2006

(54) CATADIOPTRIC OPTICAL SYSTEM AND EXPOSURE APPARATUS EQUIPPED WITH THE SAME

(75) Inventors: Yutaka Suenaga, Yokohama (JP); Tomohiro Miyashita, Kamakura (JP); Kotaro Yamaguchi, Yokohama (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 09/615,081

(22) Filed: Jul. 12, 2000

(30) Foreign Application Priority Data

Jul. 13, 1999  (JP) ............................................ 11-199467

(51) Int. Cl.
 G02B 17/00  (2006.01)
 G02B 21/00  (2006.01)
 G02B 23/00  (2006.01)

(52) U.S. Cl. ......................... 359/365; 359/727; 359/730

(58) Field of Classification Search ................. 359/364, 359/365, 726, 730, 733, 734, 735, 736, 727
See application file for complete search history.

(56) References Cited

U.S. PATENT DOCUMENTS

| 4,241,390 A | 12/1980 | Markle et al. ............... 362/299 |
| 4,293,186 A | 10/1981 | Offner .......................... 350/27 |

(Continued)

FOREIGN PATENT DOCUMENTS

| DE | 196 39 586 | 4/1998 |
| EP | 0 779 528 | 6/1997 |
| EP | 1 079 253 | 2/2001 |
| JP | 5-173065 | 7/1993 |
| WO | WO 95/32446 | 11/1995 |

OTHER PUBLICATIONS

Owen, G. et al., "A Catadioptric Reduction Camera for Deep UV Microlithography", *Microelectronic Engineering*, vol. 11, No. 1/04, Apr. 1, 1990, pp. 219–222.

Haga, T. et al., "Large–Field(>20 x25mm$^2$) Replication by EUV Lithography", *Microelectronic Engineering,*, vol. 30, No. 1, 1996, pp. 179–182.

*Primary Examiner*—Mark A. Robinson
(74) *Attorney, Agent, or Firm*—Miles & Stockbridge

(57) ABSTRACT

A catadioptric optical system comprising a first imaging optical system for forming an intermediate image of a first plane surface, a second imaging optical system for forming a final image of the first plane surface onto a second plane surface which is substantially parallel to the first plane surface, and a catadioptric type optical system disposed in the optical path from the first plane surface to the second plane surface and including a first reflecting surface which reflects light coming from through the first plane surface and a second reflecting surface for directing the light reflected by the first reflecting surface toward the second plane surface. At least one of the first and second reflecting surfaces is a concave reflecting surface. All of the optical elements of the catadioptric optical system are disposed on a single linear optical axis.

66 Claims, 7 Drawing Sheets

U.S. PATENT DOCUMENTS

| | | | | |
|---|---|---|---|---|
| 4,685,777 A | | 8/1987 | Hirose | 350/505 |
| 4,812,028 A | | 3/1989 | Matsumoto | 350/444 |
| 5,212,593 A | | 5/1993 | Williamson et al. | 359/487 |
| 5,287,218 A | * | 2/1994 | Chen | 359/365 |
| 5,345,292 A | | 9/1994 | Shiozawa et al. | 355/67 |
| 5,488,229 A | * | 1/1996 | Elliott et al. | 250/492.2 |
| 5,515,207 A | | 5/1996 | Foo | 359/731 |
| 5,636,066 A | | 6/1997 | Takahashi | 359/726 |
| 5,652,679 A | * | 7/1997 | Freeman | 359/731 |
| 5,694,241 A | | 12/1997 | Ishiyama et al. | 359/364 |
| 5,717,518 A | | 2/1998 | Shafer et al. | 359/357 |
| 5,734,496 A | | 3/1998 | Beach | 359/366 |
| 5,737,137 A | | 4/1998 | Cohen et al. | 359/859 |
| 5,742,436 A | | 4/1998 | Furter | 359/727 |
| 5,815,310 A | * | 9/1998 | Williamson | 359/365 |
| 5,835,284 A | * | 11/1998 | Takahashi et al. | 359/726 |
| 5,956,192 A | * | 9/1999 | Williamson | 359/859 |
| 5,999,310 A | * | 12/1999 | Shafer et al. | 359/354 |
| 6,169,627 B1 | * | 1/2001 | Schuster | 359/357 |
| 6,600,608 B1 | | 7/2003 | Shafer et al. | 359/729 |
| 2001/0043391 A1 | | 9/2001 | Shafer et al. | 359/365 |
| 2002/0012100 A1 | | 1/2002 | Shafer et al. | 353/30 |
| 2002/0024741 A1 | | 2/2002 | Terasawa et al. | 359/627 |

* cited by examiner

CATADIOPTRIC OPTICAL SYSTEM AND EXPOSURE APPARATUS EQUIPPED WITH THE SAME

This application claims the benefit of Japanese Patent application No. 11-199467 which is hereby incorporated by reference.

BACKGROUND OF THE INVENTION

1. Field of the Invention

The present invention relates to a catadioptric optical system and a projection exposure apparatus equipped with the catadioptric optical system suitable when manufacturing in a photolithography process, for example, a semiconductor device or a liquid crystal display device. In particular, the invention relates to a catadioptric optical system suitable for a scanning type projection exposure apparatus.

2. Related Background Art

In a photolithography process for manufacturing semiconductor devices and the like, there is used a projection exposure apparatus by which a pattern image formed on a photomask or reticle (collectively referred to as "reticle" hereinafter) is projected and exposed onto a wafer, a glass plate, etc. coated with a photoresist or the like via a projection optical system. As the integration of the semiconductor devices and the like is improved, there has been a demand for a higher resolution of the projection optical system used in the projection exposure apparatus. In order to satisfy such a demand, there have been occurred necessities for shortening the wavelength of illumination light and increasing the numerical aperture (hereinafter referred to as "NA") of the projection optical system. In particular, regarding the exposure wavelength, replacing g-line ($\lambda$=436 nm), i-line ($\lambda$=356 nm) and, further, KrF excimer laser light $\lambda$=248 nm) are currently used. In the future, ArF excimer laser light ($\lambda$=193 nm) and $F_2$ laser light ($\lambda$=157 nm) will probably be used.

However, as the wavelength of the illumination light becomes shorter, a fewer kinds of glass materials can be practically used due to light absorption. As a result, when the projection optical system is constructed by a refraction system alone, that is, only by optical elements not including a reflecting mirror with refractive power (a concave or convex mirror), chromatic aberration cannot be corrected. Additionally, because the optical performance required of the projection optical system is extremely high, various kinds of aberrations should preferably be corrected to a level of almost no aberration. Eighteen or more lens elements are required for correcting various aberrations to a desired optical performance by a refraction type projection optical system constituted of lens elements (see, for example, Japanese Unexamined Patent Publication Hei No. 5-173065), and it is difficult to suppress light absorption and avoid manufacturing costs' increase. Moreover, when extreme ultraviolet light with a wavelength of 200 nm or less is used, the optical performance may be affected by, for example, light absorption in glass material and on an anti-reflection film on the lens surface.

Further, although the oscillation bandwidth of laser light sources with an oscillation wavelength of 200 nm or less has been considerably narrowed, the bandwidth has still a certain wavelength width. Thus, to project and expose a pattern maintaining good contrast, correction of chromatic aberration of the order of pm (pico meter) is required. The optical system disclosed in the above-mentioned Japanese Unexamined Patent Publication Hei No. 5-173065 is a refraction type lens system made from a single kind of glass material, and its chromatic aberration is too large to be used with a light source having a wavelength width.

On the other hand, a reflection type optical system utilizing power (refractive power) of a concave mirror and the like does not effect chromatic aberration and, with respect to Petzval sum, creates a contribution with an opposite sign to a lens element. As a result, a so-called catadioptric optical system (hereinafter referred to as "catadioptric optical system"), which combines a catoptric optical system and a dioptric optical system together, can correct chromatic aberration as well as other various aberrations to a level of almost no aberration without increasing the number of lenses. Thus, a catadioptric optical system is an optical system having at least one lens element and at least one reflecting mirror with refractive power.

However, when a concave mirror is incorporated on the optical axis of a projection optical system of a projection exposure apparatus, light from the reticle side incident on the concave mirror is reflected toward the reticle. Addressing this problem, techniques to separate the optical path of light incident on a concave mirror from the optical path of light reflected by the concave mirror and also to direct the reflected light from the concave mirror to the wafer direction, i.e., various techniques to implement a projection optical system by a catadioptric optical system, have been extensively proposed.

However, when using a beam splitter as is used in the optical system disclosed in Japanese Unexamined Patent Publication Hei No. 5-281469, it is difficult to secure large-sized glass material for manufacturing the optical system. In addition, in the case of another proposed optical system, an optical path folding mirror (folding mirror) or a beam splitter is required and a plurality of lens barrels are required for manufacturing the optical system, resulting in such problems as difficulties in manufacture or in adjusting optical elements. A light beam impinges obliquely onto a plane reflecting mirror (folding mirror) for changing the optical path direction incorporated in a catadioptric optical system as necessary. Accordingly, extremely high surface accuracy of the mirror is required, resulting thus in the difficulty of the manufacture of the mirror. Further, the mirror is easily affected by vibration.

Meanwhile, when an optical path separating method disclosed in U.S. Pat. No. 5,717,518 is used, optical elements constituting a optical system can all be disposed along a single optical axis. As a result, the optical system can be manufactured with high accuracy following an optical element adjustment method conventionally used in the projection optical system manufacture. However, the system requires a central light-shielding portion to shield light beam propagating along the optical axis, resulting in the contrast deterioration of a pattern of a certain frequency.

Additionally, because it is difficult to provide an anti-reflection film with sufficient optical performance in the extreme ultraviolet wavelength region, it is also required that the number of optical elements constituting an optical system be reduced as much as possible.

As can be seen from the above, it is preferable that, to expose a pattern having a linewidth of 0.18 μm or less, an optical system in which a good chromatic aberration correction capability is realized even when using a light source with a wavelength of 200 nm or less such as ArF or $F_2$ laser, no central light-shielding is used, a high numerical aperture of NA 0.6 or more can be secured, and the number of refractive and reflecting components is reduced as much as possible be provided

SUMMARY OF THE INVENTION

The present invention has been made in view of the above problems, and the object of the invention is to provide a catadioptric optical system in which chromatic aberration is well corrected in the extreme ultraviolet wavelength region, in particular, even in the wavelength region of 200 nm or less, and a NA (0.6 or more) necessary for high resolution is secured, and the number of refractive and reflecting components is reduced as much as possible; a projection exposure apparatus equipped with the optical system.

To resolve the above problems, the present invention provides a catadioptric optical system, which comprises a first catadioptric type imaging optical system for forming an intermediate image of a first surface and a second refraction type imaging optical system for telecentically forming the final image of said first surface onto a second surface based on said light from said intermediate image;

wherein said first imaging optical system has a lens group including at least one positive lens element, a first reflecting surface which reflects light passed through said lens group, and a second reflecting surface for directing light reflected by said first reflecting surface to said second imaging optical system; at least one of said first and second reflecting surfaces is a concave reflecting surface; and said second imaging optical system has an aperture diaphragm;

wherein all of the optical elements of said catadioptric optical system are disposed on a single linear optical axis, and said first surface and said second surface are plane surfaces which are approximately mutually parallel; and wherein an exit pupil of said catadioptric optical system is approximately circular. Here, the second reflecting surface has an aperture portion (hole) at an off-axis position for making light from the first surface pass or pass through in the direction of the first reflecting surface, and the first reflecting surface also has an aperture portion (hole) for making the light reflected by said second reflecting surface pass or pass through in the direction of the second imaging optical system.

That the exit pupil is substantially circular means that there is no shielding object in the neighborhood of the center of the optical axis.

Further, in the present invention, the following condition is preferably satisfied:

$$0.04 < |fM1|/L < 0.4$$

wherein fM1 is a focal length of said concave reflecting surface of said first or second reflecting surface, and L is a distance along the optical axis from said first surface to said second surface.

Further, in the present invention, the following condition is preferably satisfied:

$$0.6 < |\beta M1| < 20$$

wherein βM1 is a magnification of said concave reflecting surface of said first or second reflecting surface.

Further, in the present invention, the following condition is preferably satisfied:

$$0.3 < |\beta 1| < 1.8$$

wherein β1 is a magnification of said first imaging optical system.

Further, the present invention provides a projection exposure apparatus comprising:

an illumination optical system for illuminating a mask on which a predetermined pattern is formed; and
a catadioptric optical system for projecting said predetermined pattern of said mask disposed on said first surface onto a photosensitive substrate disposed on said second surface.

DESCRIPTION OF THE PREFERRED EMBODIMENTS

Figure 1:
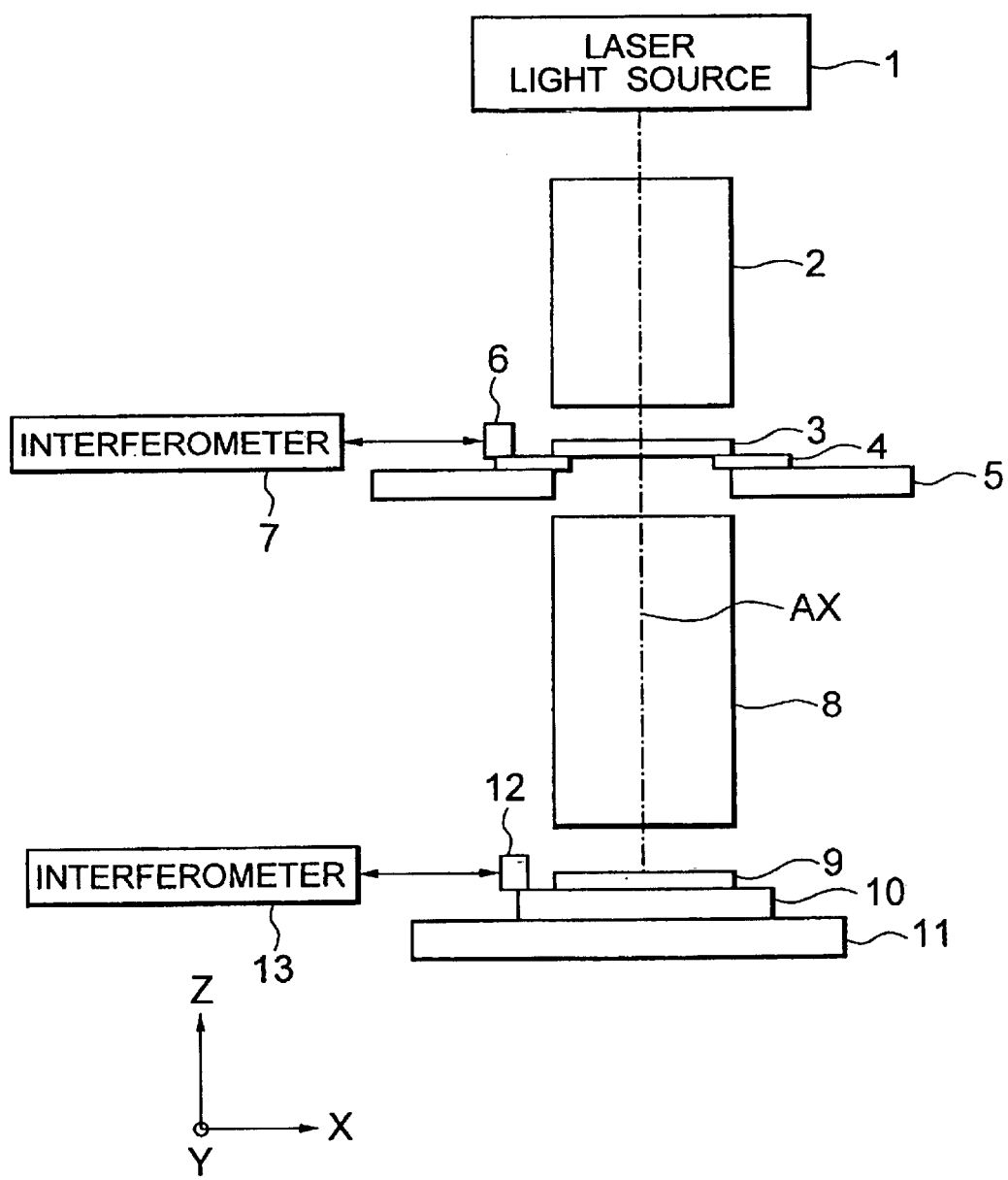
FIG. 1 is a view schematically illustrating the configuration of a projection exposure apparatus equipped with a catadioptric projection optical system to which the present invention is applied.

In the following, the catadioptric optical system in accordance with the present invention will be described with reference to the accompanying drawings. The system is a catadioptric optical system provided with a first catadioptric type imaging optical system G1 for forming an intermediate image I1 of a first surface 3 and with a second refraction type imaging optical system G2 for telecentrically forming the final image of the first surface 3 onto a second surface 9 (wafer surface, i.e., the final image plane) based on light from the intermediate image. The first optical system G1 has a lens group including at least one positive lens element, a first reflecting surface M1 which reflects light passed through the lens group and is substantially collimated, and a second reflecting surface M2 for directing light reflected by the first reflecting surface M1 to the second imaging optical system G2; and at least one of the first and second reflecting surfaces is a concave reflecting surface. Further, the second imaging optical system G2 has aperture diaphragm AS, all of the optical elements of the catadioptric optical system are disposed on a single linear optical axis AX, the first surface 3 and the second surface 9 are plane surfaces which are substantially mutually parallel; and an exit pupil of the catadioptric optical system is substantially circular. In the present invention, a structurally reasonable catadioptric optical system is achieved by making the effective projected area an annular shape and by preventing mutual interference of optical elements through appropriately positioning the first and second reflecting surfaces M1 and M2.

Further, in the present invention, the following condition is preferably satisfied:

$$0.04 < |fM1|/L < 0.4 \qquad (1)$$

wherein fM1 is a focal length of the concave reflecting surface of the first or second reflecting surface, and L is a distance along the optical axis AX from the first surface 3 to the second surface 9. The condition (1) defines an appropriate power range of the concave reflecting surface. In the present inventive optical system, positive Petzval sum created by refractive lenses is corrected by negative Petzval sum created by the concave mirror. When the power is over the upper limit value of the condition (1), the positive Petzval sum created by refractive lenses cannot be sufficiently corrected, and the flatness of the image deteriorates. In contrast, when the power is below the lower limit value of the condition (1), the Petzval sum is overcorrected, and the flatness of the image deteriorates similarly Further, in the present invention, the following condition is preferably satisfied:

$$0.6<|\beta M1|<20 \quad (2)$$

wherein βM1 represents a magnification of the concave reflecting surface of the first or second reflecting surface. The condition (2) defines an appropriate magnification range of the concave reflecting mirror. When the magnification is over the upper limit value of the condition (2) or is below the lower limit value of the condition (2), symmetricity of the first imaging system G1 is seriously affected, large coma aberration being produced, and causes the image deterioration.

Further, in the present invention, the following condition is preferably satisfied:

$$0.3<|\beta 1|<1.8 \quad (3)$$

wherein β1 is a magnification of the first imaging optical system G1. The condition (3) defines an appropriate magnification range of the first imaging optical system G1. When the magnification is over the upper limit value of the condition (3) or is below the lower limit value of the condition (3), power balance collapses, causing distortion aberration (distortion) and coma aberration, and the imaging performance deteriorates.

Further, in the present invention, it is preferable that, the first imaging optical system G1 has a light beam which intersects at least three times a plane P1 perpendicular to the optical axis AX. Light from the first surface 3, after being refracted by the lens group L1, passes through the plane P1 (the first time) to the reflecting surface M1, and, after being reflected by the surface, passes through again the plane P1 (the second time) to the reflecting surface M2. Further, the light, after being reflected by the reflecting surface M2, passes through again the plane P1 (the third time) and forms the intermediate image I1. In addition, by having made the effective projected area an annular shape, the light and the optical elements such as the reflecting surfaces M1 and M2 can be positioned so as not to physically interfere with each other.

Further, as mentioned above, the catadioptric optical system of the present invention is telecentric on the second surface 9 side (wafer surface side), but it is preferable that the optical system be additionally telecentric on the first surface 3 side (reticle surface side).

In the following, embodiments of the present invention will be described with reference to the attached drawings. FIG. 1 is a drawing schematically illustrating the overall configuration of a projection exposure apparatus equipped with a projection optical system in accordance with any embodiment of the present invention optical systems. Note that, in FIG. 1, a Z-axis is set parallel to the optical axis AX of the projection optical system 8 constituting the projection exposure optical system, an X-axis is set parallel to the plane of the drawing of FIG. 1, and a Y-axis is set perpendicular to the plane of the drawing, both of X- and Y-axes being in a plane perpendicular to the optical axis AX. Further, a reticle 3, as a projection original plate, on which a predetermined circuit pattern is formed is disposed on the object plane of the projection optical system 8, and a wafer 3, as a substrate, coated with a photoresist is disposed on the image plane of the projection optical system 8.

Light emitted from light source 1, via the illumination optical system 2, uniformly illuminates the reticle on which the predetermined pattern is formed. One or more folding mirrors for changing the optical path direction are disposed, as required, on the optical path from the light source 1 to the illumination optical system 2.

Note further that the illumination optical system 2 comprises optical systems such as an optical integrator constituted of, for example, a flyeye lens or an internal reflection type integrator for forming a plane light source having a predetermined size and shape; a variable field stop (reticle blind) for defining the size and shape of an illumination area on the reticle 3; and a field stop imaging optical system for projecting the image of this field stop on the reticle. Also note that, as an optical system from the light source 1 to the field stop, the illumination optical system disclosed in U.S. Pat. No. 5,345,292 may be applied.

The reticle 3 is, via reticle holder 4, is held on reticle stage 5 parallel to the XY plane. On the reticle 3 is formed a pattern to be transferred, and the overall pattern area is illuminated with light from the illumination optical system 2. The reticle stage 5 is so configured that the stage is two-dimensionally movable along a reticle plane (i.e., the XY plane) by the effect of a drive system, not shown, and that the coordinate position of the stage is measured by interferometer 7 using reticle moving mirror 6 and is position-controlled.

Light from the pattern formed on the reticle 3 forms, via the projection optical system 8, a mask pattern image onto the wafer which is a photosensitive substrate. The projection optical system 8 has a variable aperture diaphragm AS (see FIG. 2) near its pupil and is substantially telecentric on both of the reticle 3 and wafer 9 sides.

The wafer 9 is, via a wafer holder 10, is held on a wafer stage 11 parallel to the XY plane. Onto a substantially similar exposure area to the illuminated area on the reticle 3 is thus formed the pattern image.

The wafer stage 11 is so configured that the stage is two-dimensionally movable along a wafer plane (i.e., the XY plane) by the effect of a drive system, not shown, and that the coordinate position of the stage is measured by interferometer 13 using wafer moving mirror 12 and thus the wafer stage is position-controlled.

As described above, the field view area on the mask 3 (illumination area) and the projection area (exposure area) on the wafer 9 both defined by the projection optical system 8 are rectangle-shaped areas having a short-side along the X-axis. Aligning the mask 3 and the wafer 9 is thus performed by using the drive systems and the interferometers (7, 13), and the wafer 9 is positioned onto the image plane of the projection optical system by the use of an autofocus/autoleveling system, not shown. Further, by synchronously moving (scanning) the mask stage 5 and the wafer stage 11, and accordingly, the mask 3 and the wafer 9, along the short-side direction of the rectangle-shaped exposure and illumination areas, i.e., along the X-direction, the mask pattern is scanningly exposed onto an area on the wafer 9 of which width is equal to the long-side length of the exposure area and of which length is equal to the scanning (moving) length of the wafer 9.

Note that over the overall optical path between the light source 1 and the wafer 9 is formed an inert gas atmosphere such as nitrogen or helium gas into which the exposure light is little absorbed.

(First Embodiment)

Figure 2:
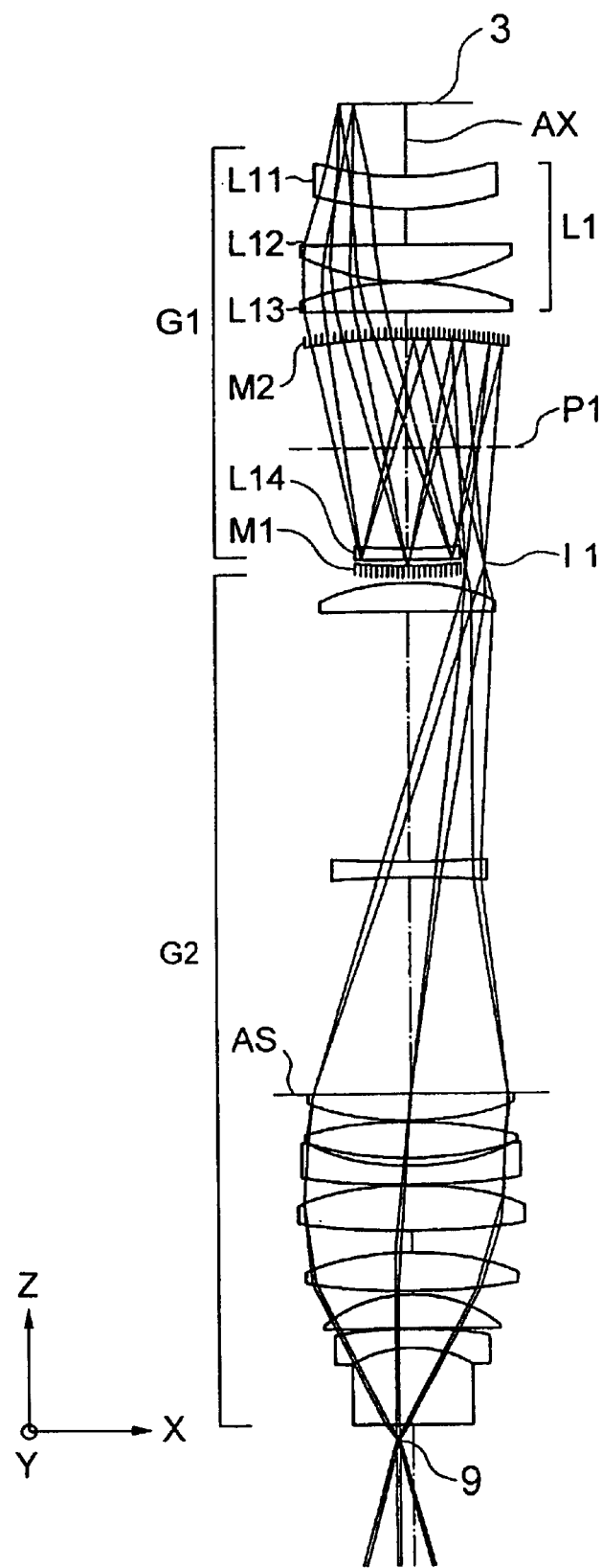
FIG. 2 is a view illustrating a lens configuration of a catadioptric optical system in accordance with a first embodiment of the present invention.

FIG. 2 is a drawing illustrating a lens configuration of a catadioptric optical system in accordance with a first embodiment of the present invention. The system is a catadioptric optical system comprising a first catadioptric type imaging optical system G1 for forming an intermediate image I1 of a reticle (first surface) 3 and a second refraction type imaging optical system G2 for telecentrically forming the final image of the reticle surface 3 onto a wafer (second surface) 9 based on light from the intermediate image I1.

The first imaging optical system G1 has a lens group L1 including at least one positive lens element, a first reflecting surface M1 which reflects light passed through the lens group L1, and a second reflecting surface M2 for directing light reflected by the first reflecting surface M1 to the second imaging optical system G2, at least one of the first and second reflecting surfaces being a concave reflecting surface, and the second imaging optical system G2 having an aperture diaphragm AS. Further, all of the optical elements of the catadioptric optical system are disposed on a single linear optical axis AX, the reticle surface 3 and the wafer surface 9 are plane surfaces which are substantially mutually parallel; and an exit pupil of the catadioptric optical system is substantially circular.

In Table 1 are listed values of items of the projection optical system in accordance with the first embodiment. In Table 1, numerals in the leftmost column represent the order of lens surfaces from the reticle 3 (first object plane) side, r is the radius of curvature of the lens surface, d is the lens surface interval from the lens surface to the next lens surface, β is the overall magnification of the catadioptric optical system, NA is the numerical aperture on the wafer side (the second surface side), and λ is the standard wavelength. Note that the refractive indexes of the glass used in the first embodiment equal to those in the second embodiment.

Further, ASP in the lens data represents an aspherical surface. In each embodiment, an aspherical surface can be expressed by the following mathematical formula:

$$Z(y^2/r)/[1+\{1-(1+\kappa)\cdot y^2/r^2\}^{1/2}]+A\cdot y^4+B\cdot y^6+C\cdot y^8+D\cdot y^{10}+E\cdot y^{12}+F\cdot y^{14}$$

wherein y is the height in the direction normal to the optical axis, Z is a displacement amount (sag amount) from the tangential plane at the apex of the aspherical surface to a position of the aspherical surface at the height y measured along the direction of the optical axis, r is the radius of curvature at the apex, κ is a conical coefficient, and A~F are aspherical coefficients of the n-th order.

Note that, in all of the values of items of the following embodiments, similar reference codes to those of this embodiment are used. Here, as an example of the unit for the radius of curvature r and the lens surface interval d in the values of items of all embodiments, mm may be used.

TABLE 1

|β| = ¼
NA = 0.75
λ = 193.3 nm

| No. | r | d | Glass Material |
|---|---|---|---|
| 1: | −211.97583 | 30.000000 | SiO2 |
| 2: | −354.80161 | 35.347349 | |
| 3: | −8888.21083 | 38.000000 | SiO2 |
| 4: | −227.79960 | 0.944905 | |
| 5: | 303.84978 | 27.415767 | SiO2 |

ASP:
κ = 0.000000
A = +0.743561 × 10⁻⁸     B = −0.230589 × 10⁻¹²
C = −0.115168 × 10⁻¹⁷    D = −0.753145 × 10⁻²²

| 6: | 237634.15996 | 30.000000 | |
| 7: | ∞ (Plane) | 214.776416 | |

TABLE 1-continued

| 8: | −348.87932 | 12.000000 | SiO2 |
| 9: | 4267.07121 | 5.579827 | |
| 10: | −362.24910 | −5.579827 | (Reflecting surface) |

ASP:
κ = 3.260270
A = +0.859110 × 10⁻⁸     B = +0.351935 × 10⁻¹²
C = −0.100064 × 10⁻¹⁵    D = +0.318170 × 10⁻¹⁹
E = −0.489883 × 10⁻²³

| 11: | 4267.07087 | −12.000000 | SiO2 |
| 12: | −348.87932 | −214.776416 | |
| 13: | 642.80918 | 246.776416 | (Reflecting surface) |

ASP:
κ = 1.840470
A = 0.198825 × 10⁻⁸      B = 0.556479 × 10⁻¹³
C = 0.597091 × 10⁻¹⁸     D = 0.492729 × 10⁻²²
E = −0.103460 × 10⁻²⁶

| 14: | 208.71115 | 33.000000 | SiO2 |
| 15: | −2529.72930 | 257.546203 | |
| 16: | −1810.41832 | 14.500000 | SiO2 |

ASP:
κ = 0.000000
A = −0.885983 × 10⁻⁷     B = −0.200044 × 10⁻¹¹
C = −0.570861 × 10⁻¹⁶    D = +0.456578 × 10⁻²²
E = −0.493085 × 10⁻²⁵

| 17: | 851.98207 | 220.408225 | |
| 18: | 15200.59096 | 30.000000 | SiO2 |
| 19: | −268.76515 | 0.200000 | |
| 20: | 434.96005 | 36.013163 | CaF2 |

ASP:
κ = 0.000000
A = −0.161380 × 10⁻⁷     B = +0.153066 × 10⁻¹²
C = +0.108604 × 10⁻¹⁷    D = +0.319975 × 10⁻²¹
E = −0.101080 × 10⁻²⁵

| 21: | −345.83883 | 10.489902 | |
| 22: | −215.91874 | 20.000000 | SiO2 |
| 23: | −619.95152 | 0.200000 | |
| 24: | 415.08345 | 40.000000 | SiO2 |
| 25: | −1275.90912 | 26.288090 | |
| 26: | 324.91386 | 35.000000 | SiO2 |
| 27: | −740.00769 | 5.214992 | |

ASP:
κ = 0.000000
A = +0.138330 × 10⁻⁷     B = +0.194125 × 10⁻¹²
C = −0.258860 × 10⁻¹⁸    D = −0.196062 × 10⁻²²
E = +0.363539 × 10⁻²⁶

| 28: | 140.91060 | 34.000000 | SiO2 |
| 29: | 1406.88948 | 0.500000 | |
| 30: | 355.40083 | 17.506069 | SiO2 |
| 31: | 98.27403 | 1.561573 | |
| 32: | 105.27944 | 75.940555 | SiO2 |
| 33: | 1597.37798 | 12.920542 | |

(Refractive index of glass material)

| | λ = 193.3 nm + 0.48 pm | λ = 193.3 nm | λ = 193.3 nm−0.48 pm |
|---|---|---|---|
| SiO2 | 1.56032536 | 1.5603261 | 1.56032685 |
| CaF2 | 1.50145434 | 1.5014548 | 1.50145526 |

(Condition correspondence value)
(1) | f M 1 | = −181.1246/1350 = 0.13417
(2) | β M 1 | = |−1.21007| = 1.21007
(3) | β 1 | = |−1.1454| = 1.1454

Figure 3:
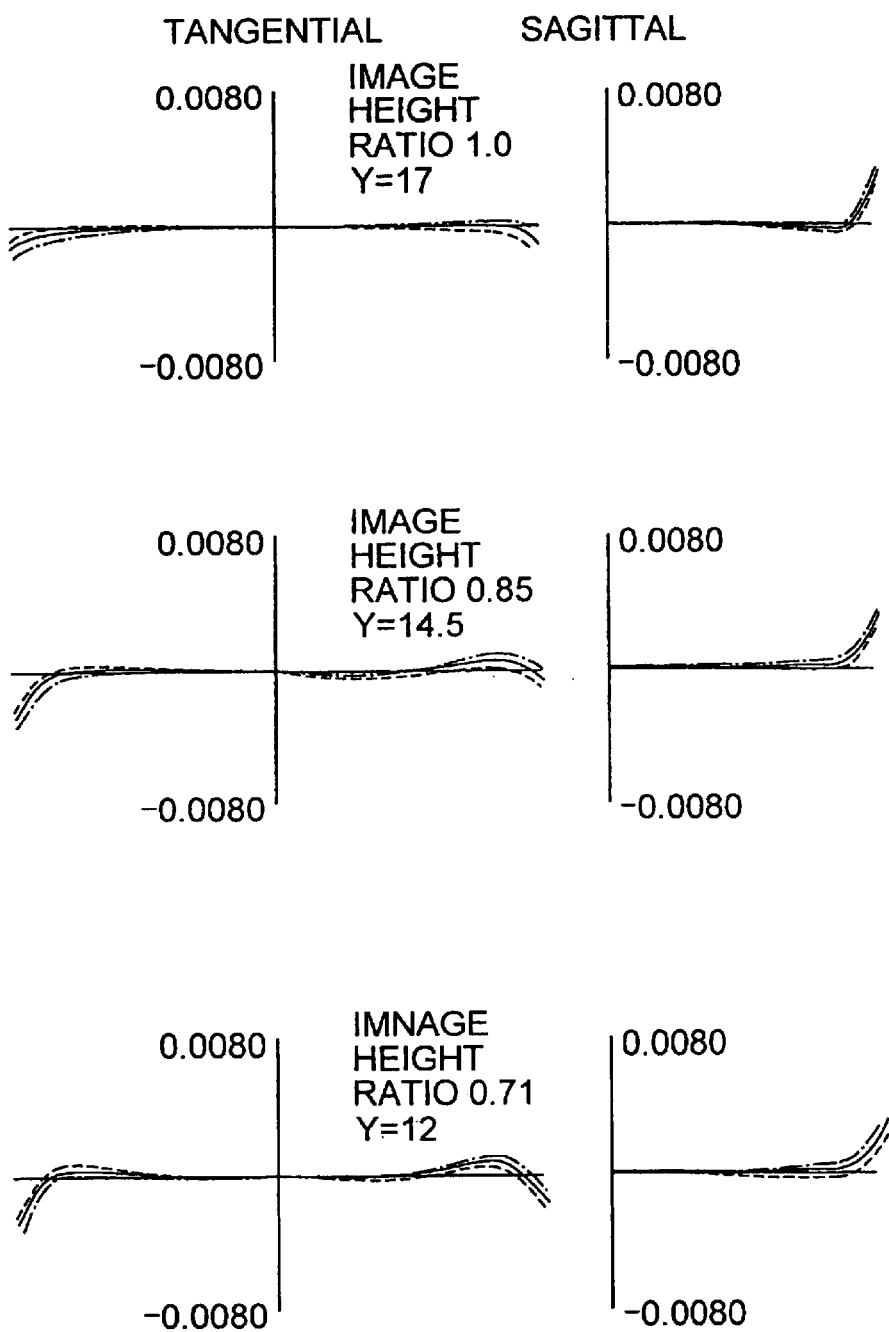
FIG. 3 is a view showing transverse aberrations of the catadioptric optical system in accordance with the first embodiment.

FIG. 3 shows transverse aberrations (coma aberrations) of the catadioptric optical system in accordance with the embodiment in the meridional (tangential) and sagittal directions. In each diagram, Y indicates the image height, continuous line indicates the standard wavelength (λ=193.3 nm), dotted line indicates λ=193.3 nm+0.48 pm, and alternate long and short line indicates λ=193.3 nm−0.48 pm (the same is applied in the second embodiment). Note that, in all of the various aberration diagrams of the following embodiments, similar reference codes to those of this embodiment are used. As can be clearly seen from the aberration diagrams, aberrations are well-balancedly corrected in the overall exposure area in the catadioptric optical system of this embodiment in spite of the both-sides telecentricity along with the imaging performance deterioration due to the light absorption by the applied glass materials being prevented.

(Second Embodiment)

Figure 4:
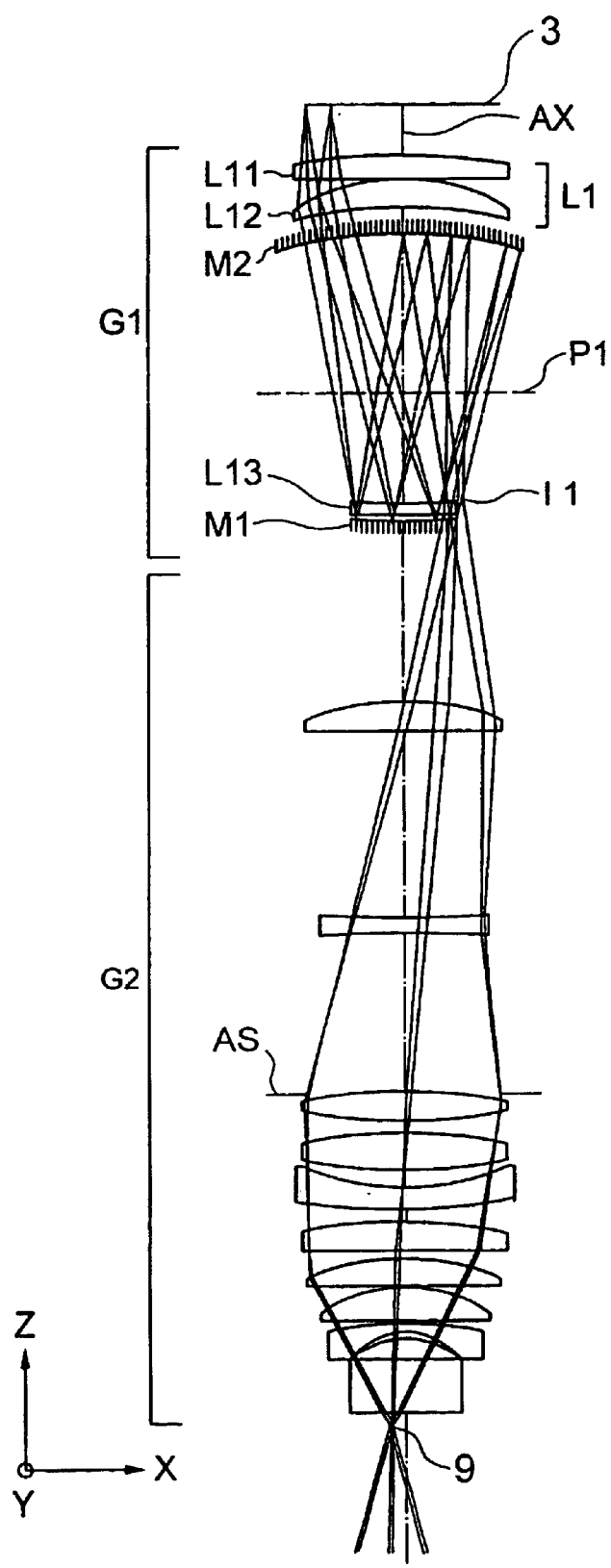
FIG. 4 is a view illustrating a lens configuration of a catadioptric optical system in accordance with a second embodiment of the present invention.

FIG. 4 is a drawing illustrating a lens configuration of a catadioptric optical system in accordance with a second embodiment. The system is a catadioptric optical system comprising a first catadioptric type imaging optical system G1 for forming an intermediate image I1 of a reticle (first surface) 3 and a second refraction type imaging optical system G2 for telecentrically forming the final image of the reticle surface 3 onto a wafer (second surface) 9 based on light from the intermediate image I1.

The first imaging optical system G1 has a lens group L1 including at least one positive lens element, a first reflecting surface M1 which reflects light passed through the lens group L1, and a second reflecting surface M2 for directing light reflected by the first reflecting surface M1 to the second imaging optical system G2; at least one of the first and second reflecting surfaces is a concave reflecting surface; and the second imaging optical system G2 has an aperture diaphragm AS. Further, all of the optical elements of the catadioptric optical system are disposed on a single linear optical axis AX, the reticle surface 3 and the wafer surface 9 are plane surfaces which are substantially mutually parallel; and an exit pupil of the catadioptric optical system is substantially circular.

In Table 2 are listed values of items of the projection optical system in accordance with the second embodiment. Note that reference codes in Table 2 are similarly defined as those in FIG. 1, aspherical surface ASP can be expressed by the above-described mathematical formula.

TABLE 2

|β| = 1/6
NA = 0.75
λ = 193.3nm

| No. | r | d | Glass Material |
|---|---|---|---|
| 1: | 521.54601 | 23.000000 | SiO2 |
| 2: | −191794.5079 | 0.944905 | |
| 3: | 194.28987 | 30.000000 | SiO2 |

ASP:
κ = 0.000000
A = −0.155326 × $10^{-8}$          B = −0.140791 × $10^{-12}$
C = +0.176234 × $10^{-17}$         D = −0.155625 × $10^{-21}$

| 4: | 452.66236 | 300.000000 | |
| 5: | −589.38426 | 12.000000 | SiO2 |
| 6: | 1106.79674 | 5.000000 | |
| 7: | −482.64964 | −5.000000 | (Reflecting surface) |

ASP:
κ = 7.430564
A = +0.199000 × $10^{-8}$          B = −0.957889 × $10^{-12}$
C = −0.122172 × $10^{-15}$         D = +0.305937 × $10^{-19}$
E = −0.126279 × $10^{-22}$

| 8: | 1106.79671 | −12.000000 | SiO2 |
| 9: | −589.38426 | −273.707398 | |

TABLE 2-continued

| 10: | 455.39924 | 477.535323 | (Reflecting surface) |
|---|---|---|---|

ASP:
κ = 0.000000
A = +0.434199 × $10^{-9}$          B = +0.327908 × $10^{-14}$
C = +0.360429 × $10^{-19}$         D = −0.622589 × $10^{-24}$

| 11: | 300.69546 | 29.000000 | SiO2 |
| 12: | −3836.44237 | 191.527911 | |
| 13: | −4996.75666 | 15.000000 | SiO2 |

ASP:
κ = 0.000000
A = −0.601871E-07                  B = −0.111865 × $10^{-11}$
C = −0.177478 × $10^{-16}$         D = +0.104425 × $10^{-23}$
E = −0.236872 × $10^{-25}$

| 14: | 1631.22452 | 164.229823 | |
| 15: | 761.43970 | 32.000000 | SiO2 |
| 16: | −416.24467 | 7.787594 | |
| 17: | 385.90210 | 43.198650 | CaF2 |

ASP:
κ = 0.000000
A = −0.127289 × $10^{-7}$          B = +0.112712 × $10^{-12}$
C = −0.237720 × $10^{-18}$         D = +0.283035 × $10^{-21}$
E = −0.177785 × $10^{-25}$

| 18: | −325.55463 | 16.575364 | |
| 19: | −220.30976 | 20.000000 | SiO2 |
| 20: | −755.61144 | 9.063759 | |
| 21: | 359.10784 | 37.871908 | SiO2 |
| 22: | −1575.91947 | 1.464560 | |
| 23: | 235.63612 | 32.000000 | SiO2 |
| 24: | −2200.62013 | 1.000000 | |

ASP:
κ = 0.000000
A = +0.198616 × $10^{-7}$          B = −0.109623 × $10^{-12}$
C = 0.106669 × $10^{-16}$          D = −0.466071 × $10^{-2}$
E = +0.853932 × $10^{-26}$

| 25: | 159.89570 | 33.600000 | SiO2 |
| 26: | 2158.79385 | 0.000000 | |
| 27: | 406.09986 | 9.500000 | SiO2 |
| 28: | 68.76384 | 4.196119 | |
| 29: | 70.58705 | 75.473363 | SiO2 |
| 30: | 2340.17874 | 9.379567 | |

(Condition correspondence value)
(1) |f M 1| = 241.3248/1339.26 = 0.18019
(2) |β 1| = |−12.51| = 12.51
(3) |β 1| = |−0.6135| = 0.6135

Figure 5:
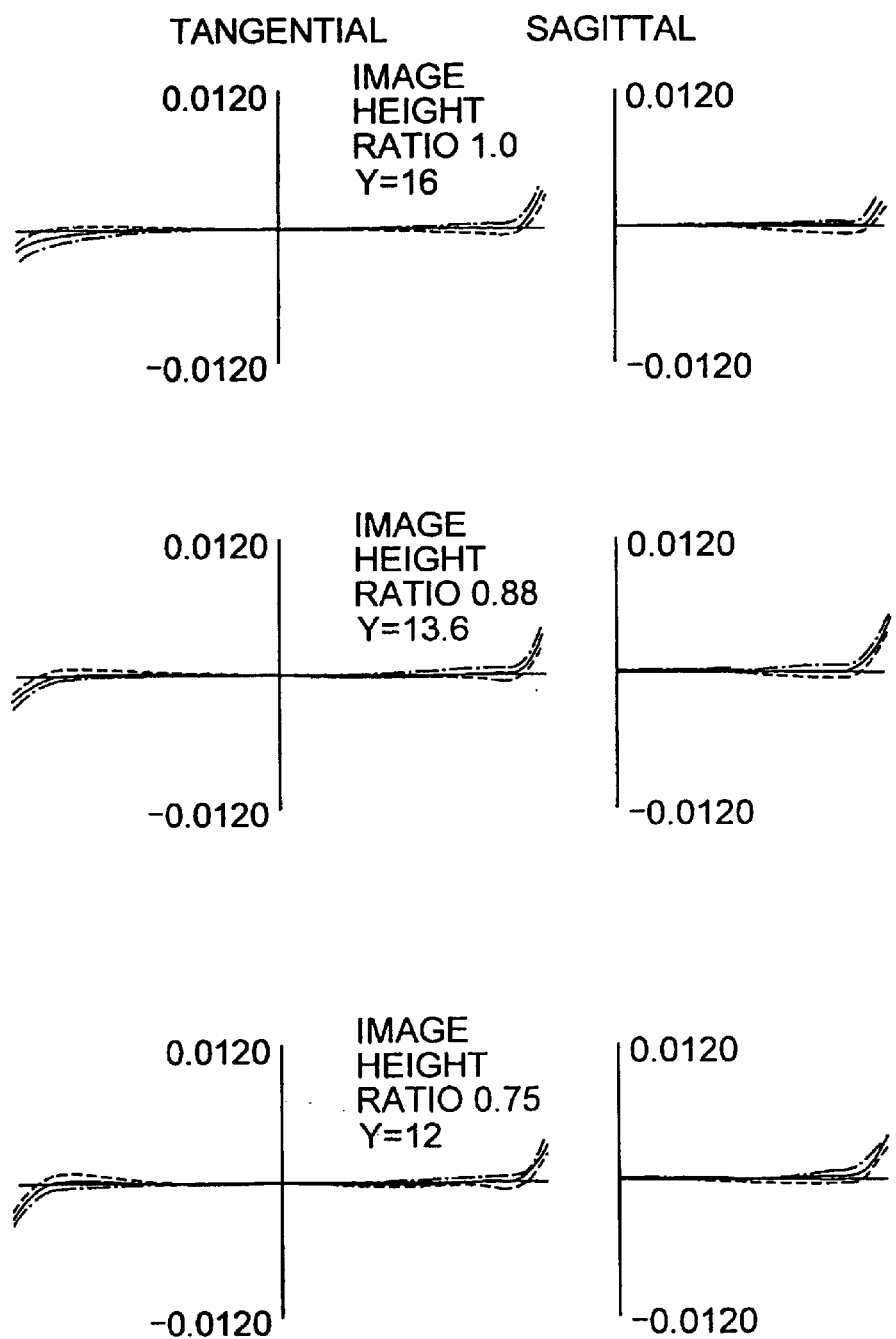
FIG. 5 is a view showing transverse aberrations of the catadioptric optical system in accordance with the second embodiment.

FIG. 5 shows transverse aberration diagrams of the catadioptric optical system in accordance with the second embodiment. As can be clearly seen also from the aberration diagrams, aberrations are well-balancedly corrected in the overall exposure area.

(Third Embodiment)

Figure 6:
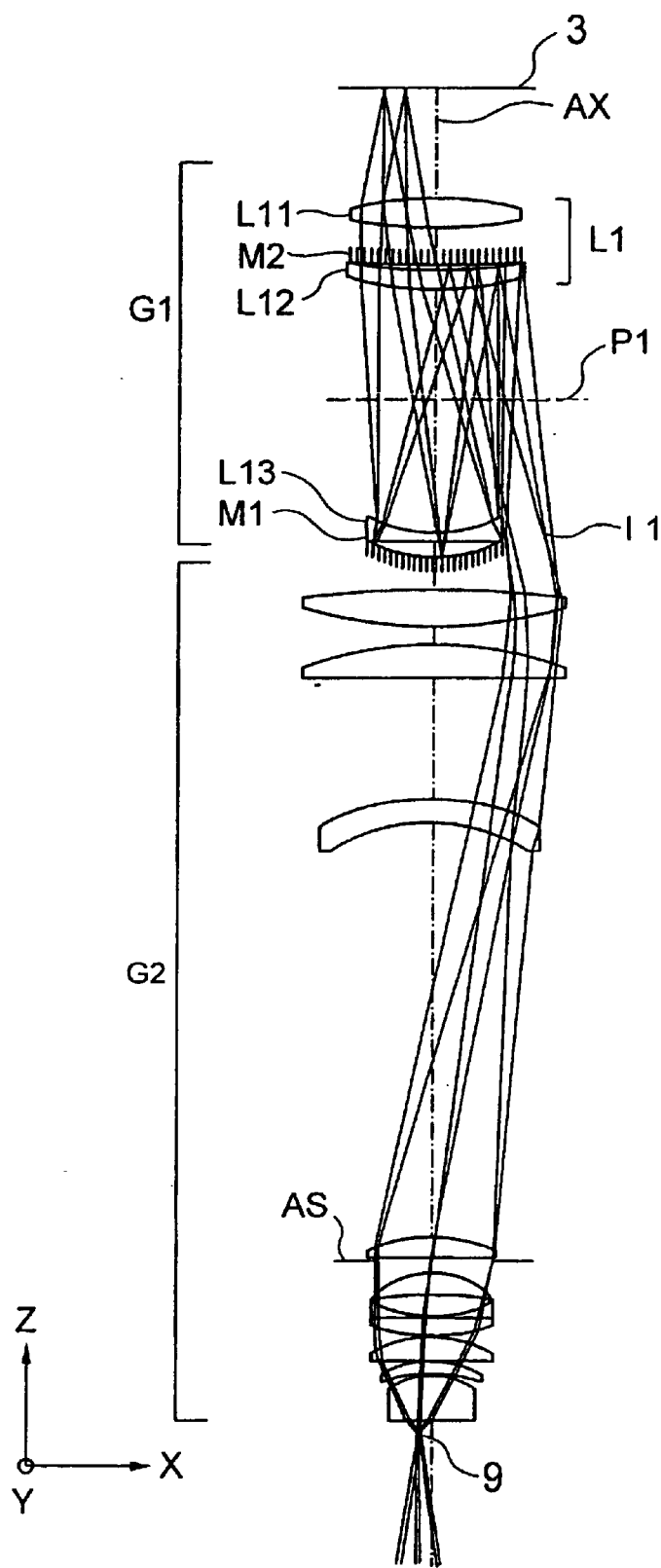
FIG. 6 is a view illustrating a lens configuration of a catadioptric optical system in accordance with a third embodiment of the present invention.
Figure 7:
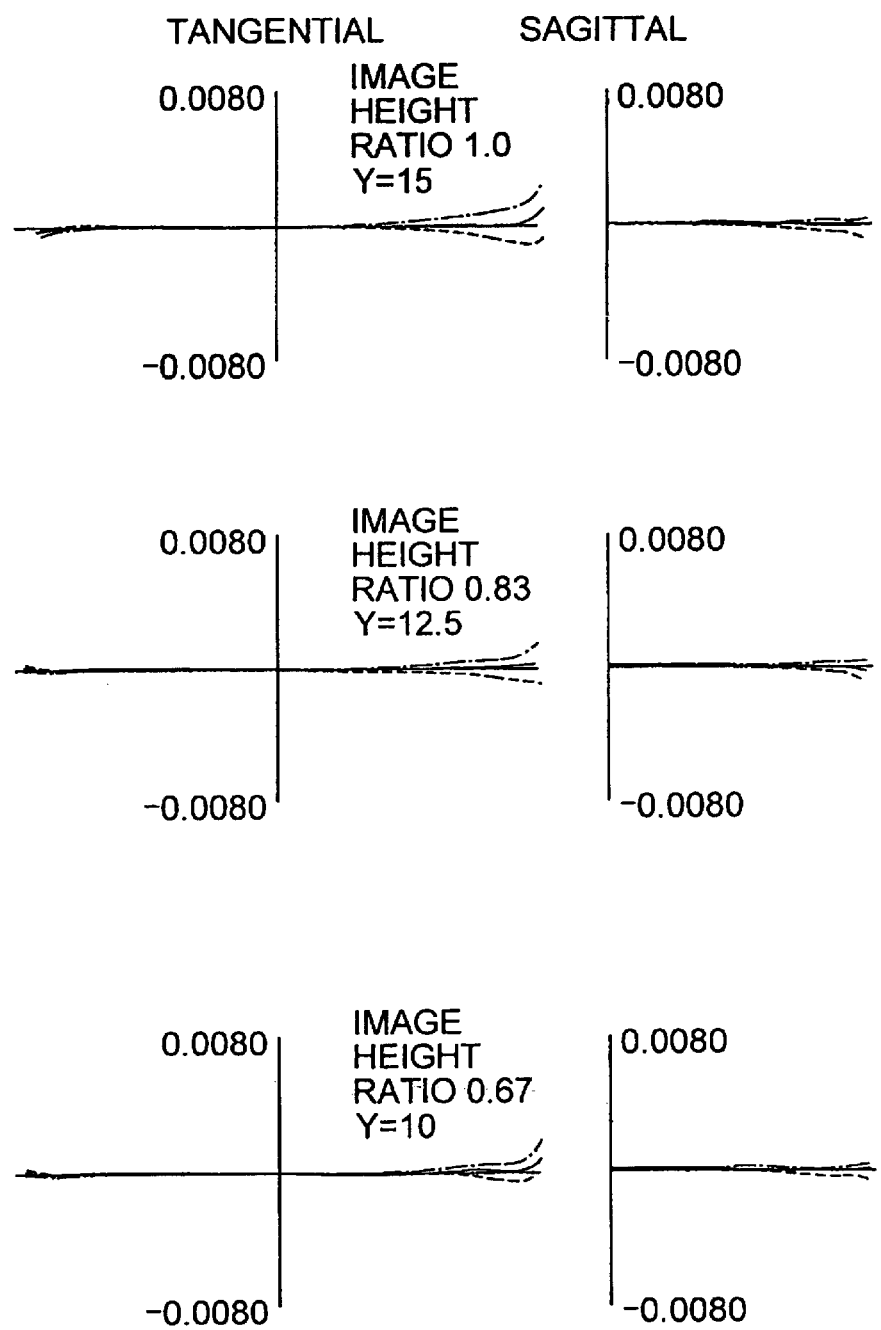
FIG. 7 is a view showing transverse aberrations of the catadioptric optical system in accordance with the third embodiment.

FIG. 6 is a drawing illustrating a lens configuration of a catadioptric optical system in accordance with a third embodiment. The system is a catadioptric optical system comprising a first catadioptric type imaging optical system G1 for forming an intermediate image I1 of a reticle (first surface) 3 and a second refraction type imaging optical system G2 for telecentrically forming the final image of the reticle surface 3 onto a wafer (second surface) 9 based on light from the intermediate image I1.

The first imaging optical system G1 has a lens group L1 including at least one positive lens element, a first reflecting surface M1 which reflects light passed through the lens group L1, and a second reflecting surface M2 for directing light reflected by the first reflecting surface M1 to the second imaging optical system G2; at least one of the first and second reflecting surfaces is a concave reflecting surface; and the second imaging optical system G2 has an aperture diaphragm AS. Further, all of the optical elements of the catadioptric optical system are disposed on a single linear optical axis AX, the reticle surface 3 and the wafer surface 9 are plane surfaces which are substantially mutually parallel; and an exit pupil of the catadioptric optical system is substantially circular.

In Table 3 are listed values of items of the projection optical system in accordance with the third embodiment. Note that reference codes in Table 3 are similarly defined as those in FIG. 1, aspherical surface ASP can be expressed by the above-described mathematical formula.

TABLE 3

$|\beta| = \frac{1}{4}$
$NA = 0.75$
$\lambda = 157.6\text{nm}$

| No. | r | d | Glass Material |
|---|---|---|---|
| 1: | 314.69351 | 28.000000 | CaF2 |
| 2: | −934.65900 | 37.000000 | |

ASP:
$\kappa = 0.000000$
$A = -0.229218 \times 10^{-7}$   $B = +0.947150 \times 10^{-12}$
$C = -0.128922 \times 10^{-16}$   $D = -0.190103 \times 10^{-20}$
$E = -0.386976 \times 10^{-25}$

| 3: | −639.17871 | 23.000000 | CaF2 |

ASP:
$\kappa = 0.000000$
$A = -0.108326 \times 10^{-7}$   $B = +0.924937 \times 10^{-12}$
$C = -0.326453 \times 10^{-16}$   $D = -0.342966 \times 10^{-20}$
$E = +0.132323 \times 10^{31\ 25}$

| 4: | −318.93314 | 245.763430 | |
| 5: | −108.60441 | 10.000000 | CaF2 |

ASP:
$\kappa = 0.495309$
$A = 0.486675 \times 10^{-7}$   $B = 0.492347 \times 10^{-11}$
$C = -0.606490 \times 10^{-16}$   $D = 0.180500 \times 10^{-18}$
$E = -0.766603 \times 10^{-23}$   $F = 0.138880 \times 10^{-26}$

| 6: | −2160.76276 | 14.249561 | |
| 7: | −165.34978 | −14.249561 | (Reflecting surface) |

ASP:
$\kappa = 1.132286$
$A = +0.201000 \times 10^{-7}$   $B = +0.102160 \times 10^{-11}$
$C = -0.209696 \times 10^{-16}$   $D = +0.126536 \times 10^{-19}$
$E = +0.429651 \times 10^{-24}$   $F = -0.160033 \times 10^{-29}$

| 8: | −2160.76276 | −10.000000 | CaF2 |
| 9: | −108.60441 | −245.763430 | |

ASP:
$\kappa = 0.495309$
$A = +0.486675 \times 10^{-7}$   $B = +0.492347 \times 10^{-11}$
$C = -0.606490 \times 10^{-16}$   $D = +0.180500 \times 10^{-18}$
$E = -0.766603 \times 10^{-23}$   $F = +0.138880 \times 10^{-26}$

| 10: | −318.93314 | −23.000000 | CaF2 |
| 11: | −639.17869 | −4.391997 | |

ASP:
$\kappa = 0.000000$
$A = -0.108326 \times 10^{-7}$   $B = +0.924936 \times 10^{-12}$
$C = -0.326453 \times 10^{-16}$   $D = -0.342966 \times 10^{-20}$
$E = +0.132323 \times 10^{-25}$

| 12: | −1183.44883 | 4.391997 | (Reflecting surface) |

TABLE 3-continued

ASP:
$\kappa = 0.000000$
$A = -0.183262 \times 10^{-10}$   $B = -0.246349 \times 10^{-12}$
$C = +0.147599 \times 10^{-16}$   $D = +0.182045 \times 10^{-20}$
$E = -0.115790 \times 10^{-25}$

| 13: | −639.17869 | 23.000000 | CaF2 |

ASP:
$\kappa = 0.000000$
$A = -0.108326 \times 10^{-7}$   $B = +0.924936 \times 10^{-12}$
$C = -0.326453 \times 10^{-16}$   $D = -0.342966 \times 10^{-20}$
$E = +0.132323 \times 10^{-25}$

| 14: | −318.93314 | 300.763420 | |
| 15: | 756.86009 | 41.000000 | CaF2 |
| 16: | −412.30872 | 15.942705 | |

ASP:
$\kappa = 0.000000$
$A = +0.361860 \times 10^{-8}$   $B = +0.893121 \times 10^{-14}$
$C = +0.135118 \times 10^{-18}$   $D = -0.735265 \times 10^{-23}$
$E = +0.151108 \times 10^{-27}$

| 17: | 382.45831 | 36.000000 | CaF2 |
| 18: | 2411.92028 | 120.195566 | |
| 19: | 203.57233 | 23.670903 | CaF2 |

ASP:
$\kappa = 0.000000$
$A = -0.666118 \times 10^{-8}$   $B = -0.225767 \times 10^{-12}$
$C = -0.790187 \times 10^{-19}$   $D = -0.460596 \times 10^{-21}$
$E = 0.210563 \times 10^{-25}$   $F = -0.570908 \times 10^{-30}$

| 20: | 174.15615 | 417.834922 | |
| 21: | 164.52297 | 20.000000 | CaF2 |

ASP:
$\kappa = 0.000000$
$A = +0.153241 \times 10^{-7}$   $B = +0.610531 \times 10^{-12}$
$C = +0.252256 \times 10^{-15}$   $D = -0.150451 \times 10^{-20}$
$E = +0.326670 \times 10^{-23}$   $F = -0.132886 \times 10^{-27}$

| 22: | 746.82563 | 20.284156 | |
| 23: | 93.58470 | 23.000000 | CaF2 |

ASP:
$\kappa = 0.000000$
$A = -0.267761 \times 10^{-7}$   $B = +0.970828 \times 10^{-12}$
$C = +0.117557 \times 10^{-15}$   $D = +0.718106 \times 10^{-19}$
$E = -0.162733 \times 10^{-22}$   $F = +0.586684 \times 10^{-26}$

| 24: | 256.99945 | 21.338588 | |
| 25: | −129.21983 | 16.000000 | CaF2 |

ASP:
$\kappa = 0.000000$
$A = -0.588690 \times 10^{-8}$   $B = 0.461959 \times 10^{-12}$
$C = 0.130813 \times 10^{-14}$   $D = -0.849445 \times 10^{-19}$
$E = -0.123125 \times 10^{-22}$   $F = +0.290566 \times 10^{-26}$

| 26: | −219.48522 | 1.000000 | |
| 27: | 102.75126 | 19.500000 | CaF2 |

ASP:
$\kappa = 0.000000$
$A = -0.862905 \times 10^{-7}$   $B = -0.119006 \times 10^{-10}$
$C = -0.124879 \times 10^{-14}$   $D = -0.367913 \times 10^{-18}$
$E = -0.451018 \times 10^{-22}$   $F = +0.119726 \times 10^{-26}$

| 28: | 593.36680 | 1.000000 | |
| 29: | 83.17946 | 18.815833 | CaF2 |

ASP:
$\kappa = 0.111409$
$A = -0.393239 \times 10^{-7}$   $B = -0.723984 \times 10^{-11}$
$C = -0.679503 \times 10^{-14}$   $D = -0.115217 \times 10^{-17}$
$E = -0.763652 \times 10^{-22}$   $F = +0.381047 \times 10^{-25}$ TABLE 3-continued

| 30: | 197.09247 | 1.000000 | |
| 31: | 110.23581 | 43.599536 | CaF2 |

ASP:
$\kappa = 0.000000$
$A = +0.850436 \times 10^{-9}$    $B = +0.126341 \times 10^{-10}$
$C = +0.168625 \times 10^{-13}$    $D = +0.782396 \times 10^{-17}$
$E = -0.233726 \times 10^{-20}$    $F = +0.333624 \times 10^{-24}$

| 32: | ∞ (Plane) | 9.100000 | |

(Refractive index of glass material)
$\lambda$ = 157.6 nm + 1.29 pm    157.6 nm    157.6 nm–1.29 pm
CaF2    1.55999383    1.56    1.56000617

(Condition correspondence value)
(1) | f M 1 | = 82.6749/1350 = 0.06124
(2) | β M 1 | = |–0.96128| = 0.96128
(3) | β 1 = |–1.4453| = 1.4453

FIG. 6 shows transverse aberration diagrams of the catadioptric optical system in accordance with the third embodiment. In each diagram, Y indicates the image height, continuous line indicates the standard wavelength ($\lambda$=157.6 nm), dotted line indicates $\lambda$=157.6 nm+1.29 pm, and alternate long and short line indicates $\lambda$=157. 6 nm–1.29 pm. As can be clearly seen also from the aberration diagrams, aberrations are well-balancedly corrected in the overall exposure area.

Meanwhile, the above-mentioned embodiments are applied to a scanning type projection exposure apparatus using a step-and-scan method (scanning method) in which a mask and a wafer are synchronously scanned with the speed ratio equal to the exposure magnification β while each shot area on a wafer is exposed using an exposure area of circular arc shape (a shape partially cut out of an annular shape). However, when the exposure field is, for example, about 5 mm×5 mm square, the above-mentioned embodiments can be applied also to a step-and-repeat type (one-shot type) projection exposure apparatus in which, after the mask pattern image being transferred onto one shot area on a wafer at one shot, a process wherein the mask pattern image is exposed onto a next shot area by two-dimensionally moving the wafer repetitively is repeated. It is to be noted that because, in the step-and-scan method, good imaging performance is required only within a slit-like exposure area (a shape extending in a predetermined direction, for example, a long rectangle, a trapezoid, a long hexagon, a circular arc, etc.), a larger shot area on a wafer can be exposed without large-sizing the projection optical system.

Meanwhile, in the above-mentioned embodiments, the invention is applied to a projection exposure apparatus used for the manufacture of semiconductor devices. However, in addition to a projection exposure apparatus used for manufacture of semiconductor devices, the invention can be applied to, for example, an exposure apparatus transferring a display pattern onto a glass plate used for the manufacture of display devices including liquid crystal display devices, to an exposure apparatus transferring a display pattern onto a ceramics wafer used for the manufacture of thin film magnetic heads, to an exposure apparatus used for the manufacture of image pick-up devices (CCD, etc.). Also, the invention can be applied to an exposure apparatus transferring a circuit pattern onto a glass substrate or a silicon wafer used for the manufacture of a reticle or a mask.

The present invention is not limited to the above-mentioned embodiments, and it is obvious that the invention may be varied in many configurations without departing from the spirit and scope of the invention.

Further, the present invention can be configured as the following (A) or (B) configuration.

(A) A catadioptric optical system according to any one of claims 1–7 and 10 to 14, wherein all of the refractive elements constituting said catadioptric optical system are made from a single kind of glass material or from a plurality of glass materials including fluorite.

(B) A projection exposure apparatus comprising:
 an illumination optical system for illuminating a mask on which a predetermined pattern is formed; and
 a catadioptric optical system according to any one of claims 1–7 and 10 to 14 or to the above (A) for projecting said predetermined pattern of said mask disposed on said first surface onto a photosensitive substrate disposed on said second surface;
 wherein said illumination optical system provides light of a wavelength of 250 nm or less.

As described above, the present invention can provide a catadioptric optical system in which chromatic aberration is well corrected in the extreme ultraviolet wavelength region, in particular, even in the wavelength region of 200 nm or less, and a NA (0.6 or more) necessary for high resolution is secured, and the number of refractive and reflecting components is reduced as much as possible. Further, exposure light can be effectively used since light absorption is little because of the small number of reflecting elements and the like. Still further, the projection exposure apparatus of the present invention, being equipped with the above-mentioned catadioptric optical system, has an advantage that fine mask patterns can be accurately transferred.

What is claimed is:

1. A catadioptric optical system comprising:
 a catadioptric type optical system, which includes a lens element, a first reflecting surface and a second reflecting surface that reflects light coming from said first reflecting surface, at least one of said first and second reflecting surfaces being a concave reflecting surface, for forming an intermediate image from an object of a first plane surface; and
 a refraction type optical system for forming a second image onto a second plane surface which is substantially parallel to said first plane surface;
 wherein, light coming from said second reflecting surface passes out of an effective diameter of said first reflecting surface, and said catadioptric type optical system and said refraction type optical system are disposed between said first plane surface and said second plane surface, and
 wherein said catadioptric type optical system and said refraction type optical system are disposed on a single linear optical axis.

2. A catadioptric optical system according to claim 1, wherein said catadioptric type optical system includes a lens group including at least one positive lens, and said refraction type optical system includes an aperture diaphragm.

3. A catadioptric optical system according to claim 1, wherein an exit pupil of said catadioptric optical system is substantially circular.

4. A catadioptric optical system according to claim 1, wherein the following condition is satisfied:

$$0.04 < |fM1|/L < 0.4$$

wherein fM1 is a focal length of said concave reflecting surface of said first or second reflecting surface, and L is a distance along the optical axis from said first surface to said second surface.

5. A catadioptric optical system according to claim 1, wherein the following condition is satisfied:

$$0.6 < |\beta M1| < 20$$

wherein βM1 is a magnification of said concave reflecting surface of said first or second reflecting surface.

6. A catadioptric optical system according to claim 1, wherein the following condition is satisfied:

$$0.3 < |\beta 1| < 1.8$$

wherein β1 is a magnification of said catadioptric type optical system.

7. A catadioptric optical system according to claim 1, wherein said catadioptric type optical system includes a lens group including at least one lens element whose surface is aspherical, and said refraction type optical system includes at least one lens element whose surface is aspherical.

8. A catadioptric optical system according to claim 1, wherein at least one of said first and second reflecting surfaces is a concave reflecting surface that corrects positive Petzval sum created by said lens element.

9. A catadioptric optical system according to claim 1, wherein the catadioptric optical system has both-sides telecentricity.

10. A catadioptric optical system according to claim 1, wherein said refraction type optical system includes two kinds of glass material.

11. A projection exposure apparatus, wherein a catadioptric optical system according to claim 1 projects a predetermined pattern on a mask onto a photosensitive substrate.

12. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
a refraction type optical system for forming a final image of light coming from said object after twice reflected by said first and second reflecting surfaces and directly from said second reflecting surface, onto a second plane surface which is substantially parallel to said first plane surface,
wherein, said catadioptric type optical system and said refraction type optical system are disposed between said first plane surface and said second plane surface.

13. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
a refraction type optical system for forming a second image onto a second plane surface which is substantially parallel to said first plane surface,
wherein, said catadioptric type optical system and said refraction type optical system are disposed between said first plane surface and said second plane surface, and
wherein said catadioptric type optical system and said refraction type optical system are disposed on a single linear optical axis.

14. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
a refraction type optical system for forming a second image onto a second plane surface which is substantially parallel to said first plane surface,
wherein, said catadioptric type optical system and said refraction type optical system are disposed between said first plane surface and said second plane surface,
wherein said catadioptric type optical system includes a lens group including at least one positive lens, and said refraction type optical system includes an aperture diaphragm.

15. A catadioptric optical system according to claim 12, wherein an exit pupil of said catadioptric optical system is substantially circular.

16. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
a refraction type optical system for forming a second image onto a second plane surface which is substantially parallel to said first plane surface,
wherein, said catadioptric type optical system and said refraction type optical system are disposed between said first plane surface and said second plane surface, and
wherein the following condition is satisfied:

$$0.04 < |fM1|/L < 0.4$$

wherein fM1 is a focal length of said concave reflecting surface of said first or second reflecting surface, and L is a distance along the optical axis from said first surface to said second surface.

17. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
a refraction type optical system for forming a second image onto a second plane surface which is substantially parallel to said first plane surface, wherein, said catadioptric type optical system and said refraction type optical system are disposed between said first plane surface and said second plane surface, and
wherein the following condition is satisfied:

$$0.6 < |\beta M1| < 20$$

wherein βM1 is a magnification of said concave reflecting surface of said first or second reflecting surface.

18. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
a refraction type optical system for forming a second image onto a second plane surface which is substantially parallel to said first plane surface,
wherein, said catadioptric type optical system and said refraction type optical system are disposed between said first plane surface and said second plane surface, and
wherein the following condition is satisfied:

$$0.3 < |\beta 1| < 1.8$$

wherein β1 is a magnification of said catadioptric type optical system.

19. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
a refraction type optical system for forming a second image onto a second plane surface which is substantially parallel to said first plane surface,
wherein, said catadioptric type optical system and said refraction type optical system are disposed between said first plane surface and said second plane surface, and wherein said catadioptric type optical system includes a lens group including at least one lens element whose surface is aspherical, and said refraction type optical system includes at least one lens element whose surface is aspherical.

20. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
a refraction type optical system for forming a second image onto a second plane surface which is substantially parallel to said first plane surface,
wherein, said catadioptric type optical system and said refraction type optical system are disposed between said first plane surface and said second plane surface, and
wherein at least one of said first and second reflecting surfaces is a concave reflecting surface that corrects positive Petzval sum created by said lens element.

21. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
a refraction type optical system for forming a second image onto a second plane surface which is substantially parallel to said first plane surface,
wherein, said catadioptric type optical system and said refraction type optical system are disposed between said first plane surface and said second plane surface, and
wherein the catadioptric optical system has both-sides telecentricity.

22. A catadioptric optical system according to claim 12, wherein said refraction type optical system includes two kinds of glass material.

23. A projection exposure apparatus which projects a predetermined pattern on a mask onto a photosensitive substrate, comprising a catadioptric optical system according to claim 12 which projects a predetermined pattern on a mask onto a photosensitive substrate.

24. A method of manufacturing a catadioptric optical system comprising: providing a catadioptric type optical system, which includes a lens element, a first reflecting surface and a second reflecting surface that reflects light coming from said first reflecting surface, light coming from said second reflecting surface passing out of an effective diameter of said first reflecting surface, at least one of said first and second reflecting surfaces being a concave reflecting surface, for forming an intermediate image from an object of a first plane surface; and
providing a refraction type optical system for forming a second image onto a second plane surface which is substantially parallel to said first plane surface,
wherein, said catadioptric type optical system and said refraction type optical system are disposed between said first plane surface and said second plane surface, and said catadioptric type optical system and said refraction type optical system are disposed on a single linear optical axis.

25. A method of manufacturing a catadioptric optical system comprising:
providing a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
providing a refraction type optical system for forming a second image onto a second plane surface which is substantially parallel to said first plane surface,
wherein, said catadioptric type optical system and said refraction type optical system are disposed between said first plane surface and said second plane surface, and wherein said catadioptric type optical system includes a lens group including at least one positive lens, and said refraction type optical system includes an aperture diaphragm.

26. A method of manufacturing a catadioptric optical system according to claim 24, wherein an exit pupil of said catadioptric optical system is substantially circular.

27. A method of manufacturing a catadioptric optical system comprising:
providing a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
providing a refraction type optical system for forming a second image onto a second plane surface which is substantially parallel to said first plane surface, wherein, said catadioptric type optical system and said refraction type optical system are disposed between said first plane surface and said second plane surface, and wherein said catadioptric type optical system includes a lens group including at least one lense element whose surface is aspherical, and said refraction type optical system includes at least one lens element whose surface is aspherical.

28. A method of manufacturing a catadioptric optical system comprising:
providing a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
providing a refraction type optical system for forming a second image onto a second plane surface which is substantially parallel to said first plane surface, wherein, said catadioptric type optical system and said refraction type optical system are disposed between said first plane surface and said second plane surface, and
wherein at least one of said first and second reflecting surfaces is a concave reflecting surface that corrects positive Petzval sum created by said lens element.

29. A method of manufacturing a catadioptric optical system comprising:
providing a catadioptric type optical system, which includes a lens element, a first reflecting surface and a second reflecting surface that reflects light coming from said first reflecting surface, light coming from said second reflecting surface passing said first reflecting surface off-axis thereof, at least one of said first and second reflecting surfaces being a concave reflecting surface, for forming an intermediate image from an object of a first plane surface; and
providing a refraction type optical system for forming a second image onto a second plane surface which is substantially parallel to said first plane surface, wherein, said catadioptric type optical system and said refraction type optical system are disposed between said first plane surface and said second plane surface, and wherein the catadioptric optical system has both-sides telecentricity.

30. A method of manufacturing a catadioptric optical system according to claim 24, wherein said refraction type optical system includes two kinds of glass material.

31. A catadioptric optical system comprising:
a catadioptric type optical system, which includes a lens element, a first reflecting surface and a second reflecting surface that reflects light coming from said first reflecting surface, light coming from said second reflecting surface passing said first reflecting surface off-axis thereof, at least one of s aid first and second reflecting surfaces being a concave reflecting surface, for forming an intermediate image from an object of a first plane surface; and
a refraction type optical system for forming a second image onto a second plane surface,
wherein, said catadioptric type optical system and said refraction type optical system are disposed between said first and second plane surfaces, and
said first plane surface, said second plane surface and an image plane of said intermediate image are parallel to each other.

32. A catadioptric optical system according to claim 31, wherein said catadioptric type optical system and said refraction type optical system are disposed on a single linear optical axis.

33. A catadioptric optical system according to claim 31, wherein said catadioptric type optical system includes a lens group including at least one positive lens, and said refraction type optical system includes an aperture diaphragm.

34. A catadioptric optical system according to claim 31, wherein an exit pupil of said catadioptric optical system is substantially circular.

35. A catadioptric optical system according to claim 31, wherein the following condition is satisfied:

$$0.04 < |fM1|/L < 0.4$$

wherein fM1 is a focal length of said concave reflecting surface of said first or second reflecting surface, and L is a distance along the optical axis from said first surface to said second surface.

36. A catadioptric optical system according to claim 31, wherein the following condition is satisfied:

$$0.6 < |\beta M1| < 20$$

wherein βM1 is a magnification of said concave reflecting surface of said first or second reflecting surface.

37. A catadioptric optical system according to claim 31, wherein the following condition is satisfied:

$$0.3 < |\beta 1| < 1.8$$

wherein β1 is a magnification of said catadioptric type optical system.

38. A catadioptric optical system according to claim 31, wherein said catadioptric type optical system includes a lens group including at least one lens element whose surface is aspherical, and said refraction type optical system includes at least one lens element whose surface is aspherical.

39. A catadioptric optical system according to claim 31, wherein at least one of said first and second reflecting surfaces is a concave reflecting surface that corrects positive Petzval sum created by said lens element.

40. A catadioptric optical system according to claim 31, wherein the catadioptric optical system has both-sides telecentricity.

41. A catadioptric optical system according to claim 31, wherein said refraction type optical system includes two kinds of glass material.

42. A projection exposure apparatus which projects a predetermined pattern on a mask onto a photosensitive substrate, wherein said catadioptric optical system according to claim 31, projects said predetermined pattern onto said photosensitive substrate.

43. A projection exposure method comprising:
preparing a catadioptric optical system according to claim 1; and
projecting an image of a predetermined pattern on a mask onto a photosensitive substrate using the catadioptric optical system.

44. A projection exposure method comprising:
preparing a catadioptric optical system according to claim 12; and
projecting an image of a predetermined pattern on a mask onto a photosensitive substrate using the catadioptric optical system.

45. A projection exposure apparatus which projects a predetermined pattern on a mask onto a photosensitive substrate, comprising a catadioptric optical system according to claim 13 which projects a predetermined pattern on a mask onto a photosensitive substrate.

46. A projection exposure method comprising:
preparing a catadioptric optical system according to claim 13; and
projecting an image of a predetermined pattern on a mask onto a photosensitive substrate using the catadioptric optical system.

47. A projection exposure apparatus which projects a predetermined pattern on a mask onto a photosensitive substrate, comprising a catadioptric optical system according to claim 14 which projects a predetermined pattern on a mask onto a photosensitive substrate.

48. A projection exposure method comprising:
preparing a catadioptric optical system according to claim 14; and
projecting an image of a predetermined pattern on a mask onto a photosensitive substrate using the catadioptric optical system.

49. A projection exposure apparatus which projects a predetermined pattern on a mask onto a photosensitive substrate, comprising a catadioptric optical system according to claim 16 which projects a predetermined pattern on a mask onto a photosensitive substrate.

50. A projection exposure method comprising:
preparing a catadioptric optical system according to claim 16; and
projecting an image of a predetermined pattern on a mask onto a photosensitive substrate using the catadioptric optical system.

51. A projection exposure apparatus which projects a predetermined pattern on a mask onto a photosensitive substrate, comprising a catadioptric optical system according to claim 17 which projects a predetermined pattern on a mask onto a photosensitive substrate.

52. A projection exposure method comprising:
preparing a catadioptric optical system according to claim 17; and
projecting an image of a predetermined pattern on a mask onto a photosensitive substrate using the catadioptric optical system.

53. A projection exposure apparatus which projects a predetermined pattern on a mask onto a photosensitive substrate, comprising a catadioptric optical system according to claim 18 which projects a predetermined pattern on a mask onto a photosensitive substrate.

54. A projection exposure method comprising:
preparing a catadioptric optical system according to claim 18; and
projecting an image of a predetermined pattern on a mask onto a photosensitive substrate using the catadioptric optical system.

55. A catadioptric optical system according to claim 31, wherein the catadioptric optical system has both-side telecentricity.

56. A projection exposure apparatus which projects a predetermined pattern on a mask onto a photosensitive substrate, comprising a catadioptric optical system according to claim 55 which projects a predetermined pattern on a mask onto a photosensitive substrate.

57. A projection exposure method comprising:
preparing a catadioptric optical system according to claim 55; and
projecting an image of a predetermined pattern on a mask onto a photosensitive substrate using the catadioptric optical system.

58. A projection exposure apparatus which projects a predetermined pattern on a mask onto a photosensitive substrate, comprising a catadioptric optical system according to claim 20 which projects a predetermined pattern on a mask onto a photosensitive substrate.

59. A projection exposure method comprising:
preparing a catadioptric optical system according to claim 20; and
projecting an image of a predetermined pattern on a mask onto a photosensitive substrate using the catadioptric optical system.

60. A catadioptric optical system according to claim 21, wherein the catadioptric optical system according to claim 21, wherein the catadioptric type optical system includes a lens group having at least one positive lens, and the refraction type optical system includes an aperture diaphragm.

61. A catadioptric optical system according to claim 21, wherein the catadioptric type optical system includes a lens group having at least one lens element whose surface is aspherical, and the refraction type optical system includes at least one lens element whose surface is aspherical.

62. A projection exposure apparatus which projects a predetermined pattern on a mask onto a photosensitive substrate, comprising a catadioptric optical system according to claim 21 which projects a predetermined pattern on a mask onto a photosensitive substrate.

63. A projection exposure method comprising:
preparing a catadioptric optical system according to claim 21; and
projecting an image of a predetermined pattern on a mask onto a photosensitive substrate using the catadioptric optical system.

64. A projection exposure method comprising:
preparing a catadioptric optical system according to claim 31; and
projecting an image of a predetermined pattern on a mask onto a photosensitive substrate using the catadioptric optical system.

65. A catadioptric optical system according to claim, 1 wherein said catadioptric type optical system forms a primary image of said object.

66. A catadioptric optical system according to claim 12, wherein said catadioptric type optical system forms a primary image of said object.

* * * * *